United States Patent [19]

Pfleiderer et al.

[11] 4,291,321

[45] Sep. 22, 1981

[54] MIS-FIELD EFFECT TRANSISTOR HAVING A SHORT CHANNEL LENGTH AND METHOD OF MAKING THE SAME

[75] Inventors: Hans-Jörg Pfleiderer, Zorneding; Dietrich Widmann, Unterhaching, both of Fed. Rep. of Germany

[73] Assignee: Siemens Aktiengesellschaft, Berlin & Munich, Fed. Rep. of Germany

[21] Appl. No.: 245

[22] Filed: Jan. 2, 1979

[30] Foreign Application Priority Data

Jan. 23, 1978 [DE] Fed. Rep. of Germany ....... 2802838

[51] Int. Cl.³ ............................................ H01L 29/78
[52] U.S. Cl. ...................................... 357/23; 357/20; 357/59; 357/91
[58] Field of Search ..................... 357/23, 91, 20, 59

[56] References Cited

U.S. PATENT DOCUMENTS

| | | | |
|---|---|---|---|
| 3,946,424 | 3/1976 | Tauri | 357/23 X |
| 4,001,048 | 1/1977 | Meiling | 357/23 X |
| 4,001,860 | 1/1977 | Cauge | 357/23 |
| 4,079,504 | 3/1978 | Kosa | 357/23 X |
| 4,084,175 | 4/1978 | Ouyang | 357/23 X |
| 4,095,251 | 6/1978 | Dennard | 357/23 |
| 4,128,670 | 12/1978 | Gaenssler | 357/23 X |
| 4,190,850 | 2/1980 | Tihanyi | 357/23 |

*Primary Examiner*—Martin H. Edlow
*Attorney, Agent, or Firm*—Hill, Van Santen, Steadman, Chiara & Simpson

[57] ABSTRACT

An MIS-field effect transistor comprising a semiconductor member provided with an overlying insulating layer and having a source zone and a drain zone of a first conductivity type provided with respective contacting electrodes, and a gate-electrode layer disposed therebetween, with each of said areas being surrounded by a less heavily doped area of the same conductivity type. At the source side, an additional area abuts the source zone and extends to the semiconductor surface beneath the gate-electrode layer, forming a channel having a very short length. The various dopings having different penetration depths are produced by differential implantation. A windowed mask, having windows with beveled edges at the drain-zone and the source zone, is utilized as an implantation mask, which advantageously is formed by the insulating layer and/or by the gate-electrode layer. Such a field effect transistor is particularly suited for integrated semiconductor circuits due to its high breakdown voltage and high switching speed resulting from the short channel length.

16 Claims, 6 Drawing Figures

MIS-FIELD EFFECT TRANSISTOR HAVING A SHORT CHANNEL LENGTH AND METHOD OF MAKING THE SAME

BACKGROUND OF THE INVENTION

The invention relates to an MIS-field effect transistor having a short channel length, in which an insulating layer is provided on the surface of a semiconductor member, and which contains a drain electrode and a source electrode respectively extending to the semiconductor surface, and a gate-electrode layer overlying the insulating layer between the drain and source electrodes. In such a construction, a drain zone and a source zone of a first conductivity type extend into the semiconductor member from the contact surfaces of the electrodes, with the source area, at least in a direction towards the drain zone, being surrounded by an additional area of second conductivity type which extends to the semiconductor surface beneath the gate electrode.

Such a MIS-field effect transistor may be designated a "doubly-diffused MIS-FET" and has a short channel length. Doping material of a specific conductivity type is diffused into the semiconductor member through a mask opening in order to produce the short channel, and the doping material in the semiconductor member thereby also extends laterally beyond the borders of the mask opening by means of under-diffusion. The actual source zone is thereafter produced as a result of doping material, of the other conductivity type, being diffused through the same mask opening in a second doping step. By suitable selection of the diffusion temperature and diffusion time, such second doping results in the lateral diffusion, under the edge of the mask, being less than in the first doping step. The two doped areas abut the substrate surface at spaced points, and the portion of the semiconductor substrate disposed between such points, essentially the width by which the first doping was driven deeper into the semiconductor than that of the source-doping, defines the channel across which the gate electrode is arranged. Channel lengths as low as approximately 1.5 $\mu m$ can be obtained with such method.

Shorter channel lengths cannot be produced with sufficient reproducibility by this double diffusion method, as the doping profile increasingly widens or expands when doping material is impregnated by means of diffusion. For this reason, a relatively large minimum limit for the obtainable channel length inherently results. In addition, the diffusion is heavily dependent upon temperature, whereby small temperature differentials have a disadvantageous effect in the reproduction capability of such method.

In addition, the relatively low breakthrough voltage in a MIS-FET is disadvantageous for many utilization purposes. For a standard -p-channel MOS-FET, such breakthrough voltage is in the neighborhood of -30 V and is subject to the "field crowding" effect as the electric field in the drain zone becomes increasingly closer to the gate electrodes than the field in the semiconductor member per se, when the breakthrough voltage is exceeded. (See Tokuyama et al in "Microelectronics", 1976, pages 177 through 181.)

BRIEF SUMMARY OF THE INVENTION

The invention has as its primary objective, the production of a MIS-field effect transistor, whose channel length is greatly decreased, for example, to 0.1 $\mu m$ or less, resulting in a considerable improvement in the switching speed or high frequency behavior of the transistor. The invention also enables the production of an MIS-FET which exhibits a higher breakthrough voltage.

These results are achieved, in accordance with the invention, by providing in an MIS-field effect transistor, a second less heavily doped area of the first conductivity type, i.e. that of the source zone, which extends between the source zone and the other adjacent area. The drain zone likewise is surrounded by a less heavily doped area, at least in the direction toward the source zone. The eventual doping of the second conductivity type, and the less heavily dopings of the first conductivity type are formed by means of implantation.

As a result of the surrounding of the heavily doped drain zone by a less heavily doped area of the same (first) conductivity type, the breakthrough voltage can be increased, and by utilizing implantation, the distribution of the charge carrier-concentration beneath the drain-electrode, which leads to an increase in the breakthrough voltage, can be very precisely adjusted.

U.S. patent application, Ser. No. 870,216, now U.S. Pat. No. 4,190,850 owned by the assignee of the present application, discloses an MIS-field effect transistor which employs an insulating layer upon a semiconductor surface, with a drain-electrode and a source-electrode respectively in contact with the semiconductor surface, and a gate-electrode layer covering the insulating layer between such electrodes, whereby one drain zone and one source zone of a first conductivity type extend into the semiconductor member from the contact surfaces of the electrodes, with the source-zone being surrounded by an additional area of a second conductivity type which abuts the semiconductor surface beneath the gate-electrode, at least in a direction towards the drain zone. Both the source zone and the other area of the second conductivity type, surrounding the source zone are formed by means of implantation. The channel length is thereby primarily determined by the width of the additional area of second conductivity type. Such width can be materially more precisely adjusted by means of implantation than by diffusion in the known, previously described double-diffused MIS-FET. However, the concentration of the implanted charge carriers of the second conductivity type in such additional area initially gradually increase in order upon reaching the concentration maximum to rapidly drop with increasing distance from the source electrode.

An additional shortening of the channel length is achieved in accordance with the invention, by implanting charge carriers of the first conductivity type, by means of an additional implantation step. Such charge carriers, have a concentration maximum lying in the additional area between the delimitation of the source zone and the concentration maximum of the charge carriers of the second conductivity type, and whose concentration is smaller than in the source zone. The slow increase of the charge carriers of the second conductivity type is thereby partially compensated or over compensated as a result of which the semiconductor member exhibits a more rapid transition from the first conductivity type of the second conductivity type in the vicinity of the source zone, and the concentration maximum is then followed by a rapid decrease of the charge carrier concentration of the second conductivity type. As a result, the channel length can be even further decreased, for example to 0.5 μm can be reliably and precisely determined.

Advantageously, the semiconductor is weakly doped with a doping material of the second conductivity type, at least beneath the gate-electrode layer.

For the production of an MIS-FET in accordance with the invention, one can proceed from the normal technique, in which a semiconductor member, contacted with a source-electrode and a drain-electrode, and covered by an insulating layer at its surface, is produced, possessing a gate-electrode layer extending across the insulating layer between the electrodes, and into which a heavily doped source-zone or drain-zone of the first conductivity type extends from the contact surfaces of the source-electrodes and the drain-electrodes. However, in contrast to the known method, additional implantations are effected before mounting the electrodes and before or after mounting the gate-electrode layer.

In connection therewith a layer, disposed on a semiconductor surface, is utilized as an implantation mask, the area of which overlying the surface provided for the gate-electrode layer being relatively thick, and having edges of beveled or wedge-shape configuration which overlap the source zone and the drain zone. Advantageously, the insulating layer required for the transistor structure or the double layer composed of the insulating layer and the gate-electrode layer, can be utilized for the covering or masking portion of the implantation mask as long as such layers are provided with windows which extend over the portions of the semiconductor surface providing for the source and drain zones, with the edges of the thicker portion of the masking structure having the beveled or wedge-shaped edge configuration tapering towards such areas.

The semiconductor surface can thus be covered by an insulating layer which is provided with windows over the desired areas which are thinner in comparison with the remaining portion of the layer, or the semiconductor surface can be completely exposed at such areas. It is important, in this connection, merely that during the subsequent implantation, the implantation particles need penetrate, at most, a thin surface layer in the windows prior to penetration of the semiconductor member in the area provided for the source zone and the drain zone, with the implantation mask being so thick outside such areas that it cannot be penetrated by the implantation particles. The beveled or wedge-shaped edge configuration of the implantation mask, and if necessary, the corresponding edges of the insulating layer and/or gate-electrode layer, can be suitable produced, for example, by a method such as described in U.S. application, Ser. No. 746,890.

The acceleration energy to be employed with the subsequent implantation of doping particles of the first conductivity type, is so selected that the doping particles in the mask openings penetrate deeper into the semiconductor member than the corresponding depth of the source zone. Beneath the beveled edges of the mask, the particles penetrate less deeply into the semiconductor member following their passage through the mask edges, so that a concentration profile is formed in which the maximum concentration always lies beneath the source zone, however, extending obliquely to the semiconductor surface in accordance with the wedge angle of the mask edges. The implantation density is thereby so selected that the area produced thereby is more weakly doped than the source zone itself. The drain zone likewise is surrounding by a more weakly doped area.

The implantation of doping particles of the second conductivity type is subsequently undertaken, in which the implantation energy is so selected that the concentration maximum of the doping particles is effected under the concentration maximum produced in the first implantation step. The area of the second conductivity type, also produced thereby, extends beneath the wedge-shaped edges of the implantation mask, i.e. of the gate-electrode layer or of the surface provided for the gate-electrode layer, obliquely upwardly to the semiconductor surface. It will be appreciated that the sequence of the implantation steps can be effected in a sequence other than that described.

Advantageously, the semiconductor member consists of silicon having a p-doping of $10^{13}$ through $10^{14}$ cm$^{-3}$. The semiconductor surface is covered by an SiO$_2$-layer, having a thickness across the gate-area and the drain zone which advantageously is less than 0.2 μm, in particular approximately 0.06 μm. Advantageously, the source-zone and drain-zone possess a n-doping of approximately $10^{19}$ cm$^{-3}$, or more, which can also be produced by diffusion or by implantation, utilizing the implantation masks provided for the subsequent implantations. Phosphorous having an acceleration energy of 20 through 50 keV, or arsenic having an acceleration of 100 through 200 keV can thus advantageously be employed. The less heavily doped areas preferably are implanted by means of implantation with phosphorous energies of approximately 80 through 300 keV and a doping of 1 through $4 \cdot 10^{12}$ cm$^{-2}$. The additional area advantageously is produced by means of implantation of boron having an acceleration energy of between approximately 100 through 300 keV and a doping of 1 through $4 \cdot 10^{12}$ cm$^{-2}$.

BRIEF DESCRIPTION OF THE DRAWINGS

In the drawings wherein like reference characters indicate like or corresponding parts.

DETAILED DESCRIPTION OF PREFERRED EMBODIMENTS

Figure 1:
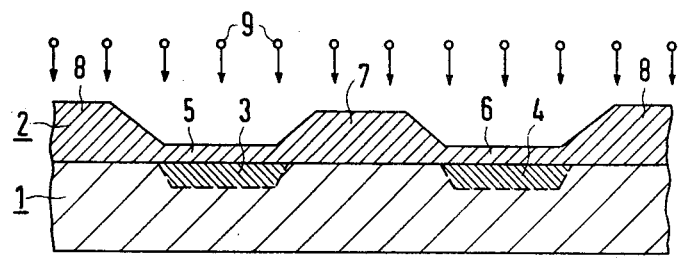
FIGS. 1-3 illustrate, a magnified section through a semiconductor member, illustrating the various depths in the production of a transistor in accordance with the present invention.
Figure 2:
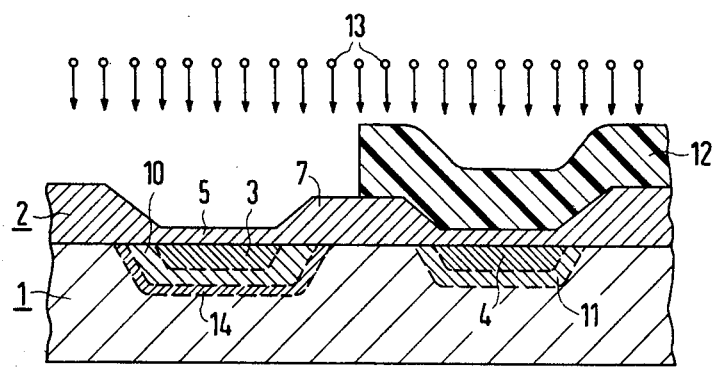
Figure 3:
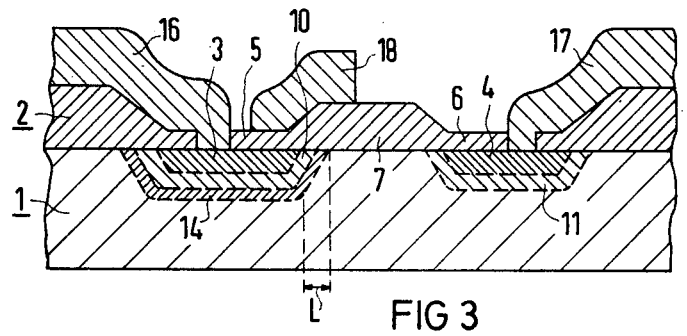

Referring to the drawings and more particularly to FIGS. 1 through 3, the reference numeral 1 designates generally a semiconductor member, weakly doped with boron, for example, having a doping of $7 \cdot 10^{14}$ cm$^{-3}$, which is provided with an insulating layer 2; advantageously consisting of SiO$_2$. Such layer has a thickness less than that of the member 1, for example, approximately 0.06 μm, at the areas provided for the source zone 3 and the drain-zone 4, and has a greater thickness, of approximately 0.6 μm, at the areas 7 and 8 between the drain and source zones and at the remaining portions of the semiconductor surface required for the construction of the transistor. The edges of the thick portions 7 and 8 are provided with a beveled or wedge-shape configuration which tapers towards the thinner layer of portions 5 and 6. A reproducible bevel or wedge angle, preferably between 15° and 60°, and in particular approximately 20°, can be suitably produced in various manners.

For example, initially proceeding from a uniformly thick insulating layer 5 of approximately 0.6 μm, the areas 5 and 6 can be suitably removed by means of an ion etching operation, in which, with the air of a mask, the insulating layer is sputtered off by ion bombardment. Thereby an etching mask with corresponding windows is produced on the insulating layer. The material for the mask can be one which may be readily removed by a sputtering-off operation. The edges of the mask are thereby beveled off in the area of the windows, and such profile of the etching mask is also transmitted to the insulating layer to be etched off. The edges of the thick insulating layer are then defined by surfaces having a bevel or wedge angle up to approximately 60°, rather than by surfaces extending vertically relative to the surface of the semiconductor substrate. A mask composed of photo lacquer is suitable as an etching mask in the practices of such a method.

However, a beveled or wedge-type profile can also be produced by utilizing a SiO$_2$-layer having disposed thereupon a phosphorous glass layer, in which case the SiO$_2$ layer may also be used as an insulating layer. If an opening or depression is etched in such a double layer, for example, by means of hydrofluric acid, there will be obtained obliquely extending peripheral flanks defining the opening or depression, as the phosphorous glass layer is more heavily attacked by the etching compound in the SiO$_2$ layer disposed therebelow. After the etching operation, the phosphorous glass layer can be rounded off by a melting operation.

A further possibility may comprise the bombardment of the insulating layer 2 with ions over its total surface and to subsequently effect a wet-chemical etching or plasma etching in conjunction with an etching mask. The thin surface layer of the insulating layer, imparied by the ion beam, thereby exhibits a greater removal with the wet-chemical etching or with plasma etching than the deeper areas of the insulating layer not exposed to the ion beam. Consequently, the insulating layer, beginning from the windows of the mask is removed with different etching rates which results in the insulating layer having edges which rise in a beveled or wedge-shaped configuration from the windows to the areas lying underneath the mask.

Such methods are capable of providing readily reproducible wedge-like ascending profiles. The insulating layer can be etched off in the areas of the drain and source zones down to the semiconductor surface, and the thin insulating layers 5 and 6 subsequently applied. For example, in conjunction with a suitable growth method. However, the thick insulating layer also can be etched off down to the desired thickness of the thinner layers 5 and 6.

The resulting insulating layer of different thicknesses is now utilized as an implantation mask for the production of the doped areas in the semiconductor member. For example, arsenic having an acceleration voltage of approximately 150 keV, or phosphorus having an acceleration voltage of approximately 40 keV can be implanted in a first implantation step, whereby the doping particles penetrate the semiconductor member to a depth of approximately 70 nm. The configuration of the zones 3 and 4 for the source and drain, produced in this manner, is thereby determined by the profile of the insulating layer or mask, whereby the delimitation beneath the wedge-shaped edges of the insulating layer, also extends obliquely to the surface. The doping of these areas amounts to approximately $10^{19}$ cm$^{-3}$.

In a second implantation step, indicated by the arrows 9, phosphorus having an acceleration voltage of approximately 150 keV and a doping of approximately 1 through $4 \cdot 10^{12}$ cm$^{-2}$ is subsequently implanted. The resulting concentration maximum of these doping particles lies approximately at 100 nm. Thereby, weaker n-doped zones 10 and 11 are produced beneath the source and drain zones which extend upwardly obliquely to the substrate surface beneath the wedge-shaped edges of the insulating layer 7 at each lateral edge of the zones 3 and 4, as clearly illustrated in FIGS. 2 and 3.

The drain area 6 is thereafter covered by suitable means such as a photolacquer mask 12 and, in accordance with the arrows 13, the source area is irradiated with boron ions, employing an acceleration voltage of approximately 150 keV and a doping of approximately 1 through $4 \cdot 10^{12}$ cm$^{-2}$, the source zone is irradiated. The penetration of these doping particles amounts to approximately 400 nm, and as a result, an additional p-doped zone 14 is created, which surrounds the n$^+$-doped source-zone 3 and the second n-doped zone 10, and which likewise extends obliquely to the semiconductor surface beneath the wedge-like edges of the insulating layer.

Following this doping, the photolacquer mask 12 is suitably removed and contact holes are etched into the relatively thin layers 5 and 6 of the insulating layer for effecting electrode contacting. Subsequently, contact conductor members 16 and 17 are mounted at the contact holes in the respective areas exposed of the zones 5 and 6 and a gate electrode 18 is deposited on the insulating layer 7, which overlaps the edge of the p-doped zone 14. The final structure of the MIS-FET so constructed, is illustrated in FIG. 3.

The effective channel area L is thereby defined by the width of the zone 14 on the semiconductor surface with the gate-electrode overlying such zone. It will be appreciated that by means of the self-adjusting implantation of the doping materials, and with the utilization of only a single mask, it is thereby possible to precisely adjust the channel length L. The differentiated implantation thereby provides a rapid transition from the n- to the p-conducting material between the source-zone and the drain-zone, whereby an especially small channel width can be achieved. Transistors embodying the invention therefore have a very steep characteristic curves and short switch-on times. As a result of the additional n-doping in the drain zone, a high breakthrough voltage is simultaneously additional produced.

Figure 4:
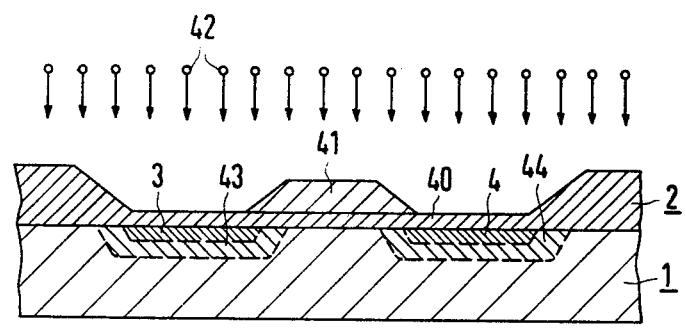
FIGS. 4-6 are similar figures illustrating a second sample embodiment of the invention.
Figure 5:
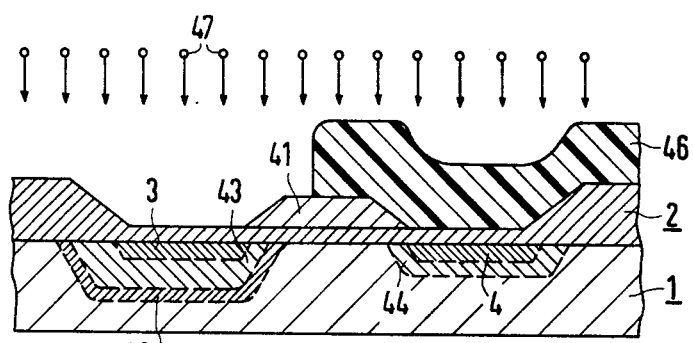
Figure 6:
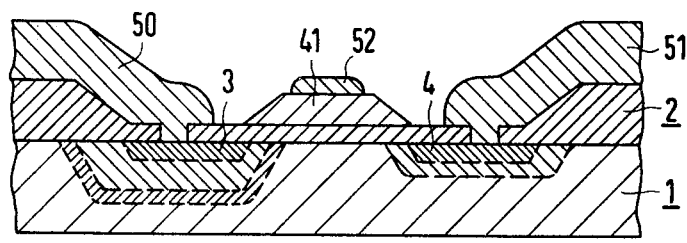

In the production of field effect transistors in accordance with the disclosure of FIGS. 4 through 6, there is additionally employed a substrate in the form of a semiconductor member 1, which exhibits a relatively weak p-doping, for example, $7 \cdot 10^{14}$ cm$^{-3}$, at least in that zone which ultimately will be disposed beneath the gate-electrode layer. The surface of the semiconductor member 1 is covered with a layer 2 of SiO$_2$ having a thickness of approximately 0.6 μm, in which is formed, by an etching operation, a window having oblique or beveled edges, which extends from the source zone 3 to the drain zone 4, and in which a gate-oxide layer 40 of 0.06 μm thickness is formed. A polysilicon layer, for example, with a heavy n-doping and a thickness of 0.1 through 0.5 μm is deposited thereupon, from which the electrode layer 41 is formed by etching. The electrode layer 41 is provided with edges of beveled or wedge-shape configuration, which, for example, can be produced by suitable sputtering-off operation. The double layer formed by the insulating layer and the gate-electrode layer can then be employed as an implantation mask.

The n+-doping of the source- and drain zones 3 and 4 can be produced by an implantation operation as in the preceding example. If implantation is effected over these areas, a drivein diffusion can be effected. In such case, the polysilicon-gate advantageously can subsequently be over-etched in order to have the original substrate doping approximately beneath the polysilicon gate. However, the doping of the source zone and the drain zone can also be achieved by means of diffusion.

Subsequently, without using any additional lacquer mask, donors are implanted (arrows 42), as in the first example, with the energy magnitude being so selected that n-doped profiles 43 and 44 are formed beneath the oblique polysilicon edge, and which follow the configuration of the n+-doped source- and gate zones 3 and 4. The magnitude or dose of such implantation advantageously is so selected that the donor concentration is equal to the acceptor concentration in the p-doped additional area to be provided for the channel. A high breakdown voltage is thereby achieved at the drain side, as no abrupt pn-transition exists.

The drain-zone is subsequently covered with a photo-lacquer mask 46, and the source-zone implanted with acceptors (arrows 47). Again, the implantation energy is so selected that such ions achieve a greater penetration depth than in the preceding n-implantation, but insufficient however to effect a penetration of the thick center portion of the double layer consisting of the gate-oxide-layer 40 and the gate-electrode layer 41. The course of the donor and acceptor concentration therefore is exactly as prescribed, and a rapid, precisely reproducible transition from the n-conductivity-type (zone 43) to the p-conductivity-type (zone 48) is achieved by the prescribed two implantation steps. The actual channel is then determined by the p-conductive zone 48, whose width can be made very small as determined by the difference in the implanted dopings. The designation "DIF-MOS" (differentially implanted MOS-transistor) is therefore suggested for this structure.

Following the desired implantations, the photolacquer mark is removed, contact holes to the source zone 3 and drain zone 4 are etched and corresponding electrodes 50 and 51 for the source and drain zones respectively, as well as a connection contact 52 to the polysilicon-gate-electrode-layer 41, are suitably applied. The gate-electrode-layer thus expediently is provided with a supply line 52 over its total surface, whereby the line resistance is lowered.

Although we have described our invention by reference to particular illustrative embodiments, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim as our invention:

1. An MIS field effect transistor having a short channel length, comprising a semiconductor substrate, on the surface of which there is arranged an insulating layer, which is in turn, provided with a gate electrode, a drain zone and a source zone, of the first conductivity type, provided in the semiconductor substrate, which zones meet the substrate surface, an additional doped zone of the second conductivity type laying below said source zone and surrounding the latter, at least in the direction of said drain zone, and which meets the substrate surface, spaced laterally with respect to said source zone below said gate electrode layer, a second less heavily doped zone of the first conductivity type extending between the source zone and said additional zone of opposite conductivity type, a less heavily doped zone of the first conductivity type surrounding said drain zone, at least in the direction of said source zone, said zone of the second conductivity type and the less heavily doped zones of the first conductivity type containing implanted dopant particles.

2. An MIS field effect transistor as claimed in claim 1, in which the thickness of said insulating layer above said channel zone gradually reduces in thickness towards said source zone to thereby from a wedge angle.

3. An MIS field effect transistor as claimed in claim 2, in which said wedge angle amounts to approximately between 15° and 60°.

4. An MIS field effect transistor as claimed in claim 3, in which said wedge angle amounts to approximately 20°.

5. An MIS field effect transistor as claimed in claim 1, in which the thickness of said gate electrode above said channel zone is reduced in a wedge-angle towards its edges.

6. An MIS field effect transistor as claimed in claim 5, in which the thickness of said gate electrode layer between said source zone and said drain zone increases in the direction of said drain zone relative to the surface of the substrate.

7. An MIS field effect transistor as claimed in claim 5, in which said wedge angle amounts to between approximately 15° and approximately 60°.

8. An MIS field effect transistor as claimed in claim 5, in which said wedge angle amounts to approximately 20°.

9. An MIS field effect transistor according to claim 1, wherein the semiconductor member is weakly doped with doping material of the second conductivity type at least at the surface beneath the gate-electrode layer.

10. An MIS field effect transistor according to claim 1, wherein the semiconductor member consists of silicon.

11. An MIS field effect transistor according to claim 6, wherein the semiconductor member contains a p-doping, preferably of boron $10^{-}$ through $10^{14}$ cm$^{-3}$.

12. An MIS field effect transistor according to claim 11, wherein the source zone area and the drain zone has an n-doping, preferably arsenic or phosphorus of approximately $10^{19}$ cm$^{-3}$ or more.

13. An MIS field effect transistor according to claim 12, wherein the weaker doped zones of the first conductivity type have an implanted n-doping, advantageously with phosphorus, of 1 to $4 \times 10^{12}$ cm$^{-2}$.

14. An MIS field effect transistor according to claim 13, wherein said additional zone of the second conductivity type has an implanted p-doping, advantageously of boron of 1 to $4 \times 10^{12}$ cm$^{-2}$.

15. An MIS field effect transistor according to claim 1, wherein the insulating layer consists of silicon dioxide.

16. An MIS field effect transistor according to claim 1, wherein the gate-electrode layer comprises polycrystalline silicon.

* * * * *